United States Patent
Smith et al.

(10) Patent No.: US 7,515,250 B2
(45) Date of Patent: Apr. 7, 2009

(54) IN-SITU INTERFEROMETER ARRANGEMENT

(75) Inventors: Adlai H. Smith, Escondido, CA (US); Robert O. Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 11/856,547

(22) Filed: Sep. 17, 2007

(65) Prior Publication Data

US 2008/0007705 A1 Jan. 10, 2008

Related U.S. Application Data

(62) Division of application No. 11/173,748, filed on Jul. 1, 2005, now Pat. No. 7,283,202, which is a division of application No. 10/623,364, filed on Jul. 18, 2003, now Pat. No. 6,963,390.

(60) Provisional application No. 60/397,312, filed on Jul. 19, 2002.

(51) Int. Cl.
G03B 27/62 (2006.01)
G03B 27/52 (2006.01)
G03B 27/42 (2006.01)
G03B 27/68 (2006.01)

(52) U.S. Cl. ............... 355/75; 355/55; 355/53; 355/52

(58) Field of Classification Search ............ 355/55, 355/67, 53, 52, 77, 75; 356/614, 399, 400, 356/401; 359/376, 559, 498, 386, 582, 564; 430/5, 30; 250/492.24
See application file for complete search history.

(56) References Cited

U.S. PATENT DOCUMENTS

| | | | |
|---|---|---|---|
| 5,756,238 A | 5/1998 | Barr et al. | |
| 5,757,469 A * | 5/1998 | Allen | 355/53 |
| 5,828,455 A | 10/1998 | Smith et al. | |
| 5,978,085 A | 11/1999 | Smith et al. | |
| 6,333,776 B1 | 12/2001 | Taniguchi | |
| 6,665,049 B1 | 12/2003 | Takahashi | |
| 6,798,570 B1 * | 9/2004 | Greenberg | 359/376 |
| 6,836,365 B2 * | 12/2004 | Goto | 359/569 |
| 2001/0017693 A1 | 8/2001 | Zheng et al. | |
| 2002/0015158 A1 * | 2/2002 | Shiode et al. | 356/614 |
| 2002/0030799 A1 * | 3/2002 | Iwasaki et al. | 355/53 |
| 2002/0036763 A1 * | 3/2002 | Krikke et al. | 355/67 |
| 2002/0171815 A1 | 11/2002 | Matsuyama et al. | |
| 2003/0122091 A1 * | 7/2003 | Almogy | 250/492.24 |

OTHER PUBLICATIONS

Y. Shiode et al., "Method of Zernike Coefficients Extraction for Optics Aberration Measurement", SPIE, vol. 4691, 2002, pp. 1453-1464.

* cited by examiner

*Primary Examiner*—Peter B Kim

(57) ABSTRACT

An in-situ interferometer includes an image modifying optic that produces light ray bundles. The light ray bundles are projected onto a reticle with a plurality of measurement fiducials encoded onto a face of the reticle. The measurement fiducials are exposed onto a sensing plane and their locations measured. Aberrations in the projection system are determined from the measurements of the exposed reticles.

12 Claims, 7 Drawing Sheets

IN-SITU INTERFEROMETER ARRANGEMENT

REFERENCE TO PRIORITY DOCUMENT

This is a divisional of U.S. patent application Ser. No. 11/173,748 filed on Jul. 1, 2005 now U.S. Pat. No.7,283,202, which is a divisional of U.S. patent application Ser. No. 10/623,364 filed on Jul. 18, 2003, now U.S. Pat. No. 6,963, 390 which claims the benefit of priority of U.S. Provisional Patent Application No. 60/397,312 filed on Jul. 19, 2002, all of which are incorporated by reference in their entirety herein.

BACKGROUND OF THE INVENTION

1. Field of the Invention

The present invention relates generally to processes for semiconductor manufacturing and more particularly to characterizing and monitoring lithographic projection lenses in-situ.

2. Description of the Related Art

Projection imaging systems, also referred to as lithographic projection systems, have many uses in various industries. For example, lithographic projection systems are used to produce patterns on semiconductor materials for use as integrated circuits and flat panel displays. The performance of lithographic projection systems greatly influences the manufacturability and cost of manufacturing semiconductor chips and flat panel displays.

In general, the performance of lithograph projection systems is limited because of aberrations, which are the deviation of a projection lens' performance from a "perfect" lens or from the diffraction limit. As the resolution required from lithography projection systems increases, for example as low as 100 nm and below, the ability to measure the state of the optical aberration of projection lenses becomes increasingly important. For example, aberrations as small as 10 milliwave (m$\lambda$) or less can cause significant shifts and distortions in patterns.

Techniques have been developed to compensate for aberrations in lithography projection systems. For example, distortion and field curvature data from images exposed using a lithography projection system are used to design "figured" optical surfaces that are placed in the optical path of the projection system to compensate for aberrations of projection systems. A drawback to these techniques is that they only consider distortion and field curvature aberrations. Distortion and field curvature correspond to the lowest order aberrations of an imaging system, namely field dependent tilt and focus. In order to ascertain the degree of correction and method of correction useful for higher order aberrations, data in addition to distortion and field curvature are needed.

Application of a conventional interferometer to a projection imaging system can provide high quality wavefront data. However, a drawback to use of a conventional interferometer is that it requires removing, or significantly altering or disturbing, the lens column of the lithographic projection system. Removal of the lens column can introduce uncertainties into the measurement and require significant downtime from productive operation.

Due, at least in part, to the drawbacks in using a conventional interferometer in-situ, techniques have been developed for determining distortion, field curvature, best focus, astigmatism, and the aerial image of a projection imaging system in-situ. Of these various in-situ techniques, the greatest amount of information is usually provided by in-situ aerial image measurements. However, a drawback to in-situ aerial image measurements is that the light level is generally low, leading to long exposure times or poor signal to noise ratios. In addition, the reconstruction of the aberrated wavefront is ambiguous unless several out of focus exposures are performed.

Thus, there is a need for an improved technique to measure the optical aberrations of lithography projection systems. The present invention satisfies this need

SUMMARY

A method and apparatus of in-situ measurement of lens aberrations that includes producing an illumination source at low partial coherence with chief rays that vary regularly as a function of position. The modified source illuminates a reticle that includes an optical element and a face encoded with measurement fiducials. The measurement fiducials are exposed onto a sensing plane. The relative positions of the exposed measurement fiducials on the sensing plane are measured. A reconstruction of the aberration is made from the measurements and known relative positions of the measurement fiducials of the encoded face.

An illumination source for in-situ measurement of lens aberrations can include a light source and a condensing lens configured to accept light from the light source. This is a simple effective source (ES) and is used for illustration. An illumination modifying optic is placed within the effective source, with the illumination modifying optic configured such that light from the light source that passes through the illumination modifying optic and condensing lens forms a plurality of light ray bundles with corresponding chief rays. A lens is between the effective source and the encoded face, wherein angles of incidence of the chief rays within the respective bundles onto the lens vary sufficiently to overfill the lens pupil.

A reticle for in-situ measurement of lens aberration determination can include an array of field points, wherein each field point comprises an array of fiducials. The reticle also includes an array of optical elements associated with each of the field points.

Other features and advantages of the present invention should be apparent from the following description of the preferred embodiment, which illustrates, by way of example, principles of the invention.

DETAILED DESCRIPTION

Methods of in-situ interferometry are described in U.S. Pat. No. 5,828,455 entitled "Apparatus, Method of Measurement, and Method of Data Analysis for Correction of Optical System" issued Oct. 27, 1998, to Smith et al.; and U.S. Pat. No. 5,978,085 entitled "Apparatus Method of Measurement, and Method of Data Analysis for Correction of Optical System" issued Nov. 2, 1999 to Smith et al., both of which are incorporated by reference herein in their entirety.

The two patents referenced above describe an in-situ interferometer that includes an image matching optic, an encoded face (EF), and an aperture plate (AP). The image matching optic increases the diversity of ray angles impinging on the encoded face so as to fill an entrance pupil of the lithographic projection system imaging objective (IO). The EF provides structures (typically at the reticle object plane) that are imaged onto a wafer and subsequently positionally measured. The AP restricts the size of the individual ray bundles and thus determines the wave front reconstruction resolution. While this in-situ interferometer is effective, it would be advantageous to reduce its complexity and the number of components that are needed.

Figure 1:
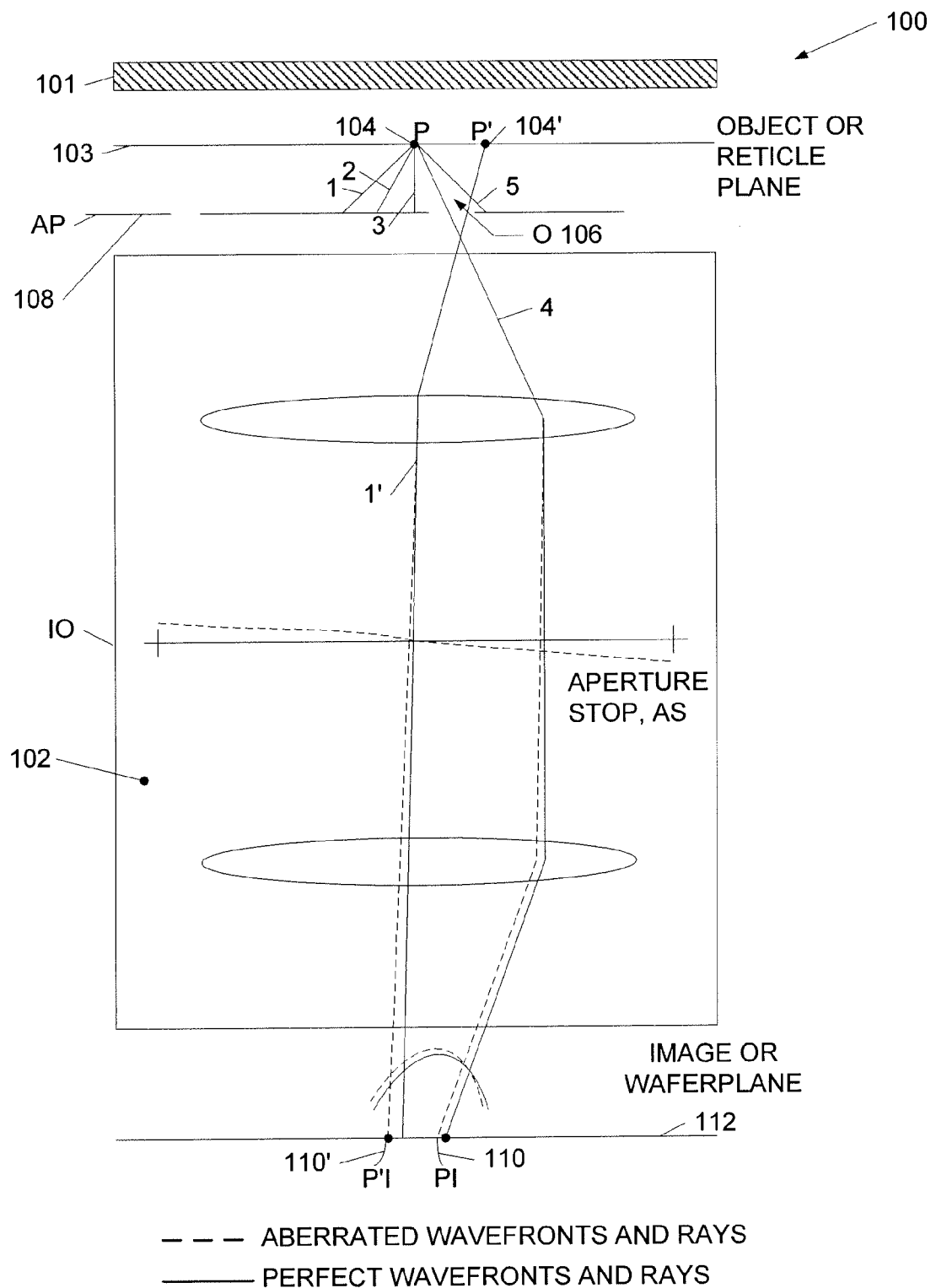
FIG. 1 is a block diagram illustrating a prior art technique of in-situ interferometer measurements.

FIG. 1 illustrates a system that can implement the technique described in the two Smith patents (U.S. Pat. No. 5,828,455 and U.S. Pat. No. 5,978,085). FIG. 1 is a block diagram illustrating a projection system 100. FIG. 1 schematically illustrates how information about aberrations are obtainable. Point P 104 in the reticle plane 103 has an aperture plate AP 108 interposed between it and the first element of the optical system. Of the rays 1, 2, 3, 4, 5 emitted from P, only ray 4 passes through the opening O 106 in the aperture plate AP 108, so that ray 4 is transmitted by the IO 102 and projected onto a wafer in image plane 112. Aberrations of the imaging objective 102 cause ray 4 to deviate (drawn as a dashed line) from the path that an unaberrated image objective would produce (drawn as a solid line). The aberrations cause the ray to intersect the wafer plane at a transverse position PI 110 differing from intersecting position for an imaging objective without aberrations (a "perfect" imaging objective) by an amount proportional to grad($\Phi$(u)). At the reticle, nearby point P' has only a small bundle of rays centered on ray 1' passing through the aperture O 106 in the aperture plate AP 108, through imaging objective 102, and intersecting the image plane 112 at the point P'I 110'. The deviation of ray 1' from its ideal imaging point is also proportional to grad($\Phi$(u')), u' being the angle or position of ray 1' as it passes through the aperture stop AS (see solid line (unaberrated) and dashed line (aberrated)).

The techniques of the Smith patents include analysis of the wavefront at a plurality of field points over the entire lens train. The technique includes using an aperture plate 108 that includes a plurality of openings 106. In FIG. 1, each opening 106 is centered underneath a neighborhood of points 104 that are accepted into the entrance pupil of the IO 102. Light passing through the points 104 and through all openings 106 in the aperture plate 108 will produce points at the image plane 112 corresponding to the number of openings 106 in the aperture plate 108. The totality of all the arrays of points whose centroids can be measured and reconstructed yield an aberrated wavefront $\phi$(u; x) at a number of discrete points across the image plane 112.

While this technique overcomes many of the shortcomings of other techniques it requires inserting a reticle 103 and an aperture plate 108 between the image matching optic 101 and the IO 102, thereby decreasing the light level. In accordance with the invention, an in-situ interferometer system can be provided without an aperture plate.

Figure 2:
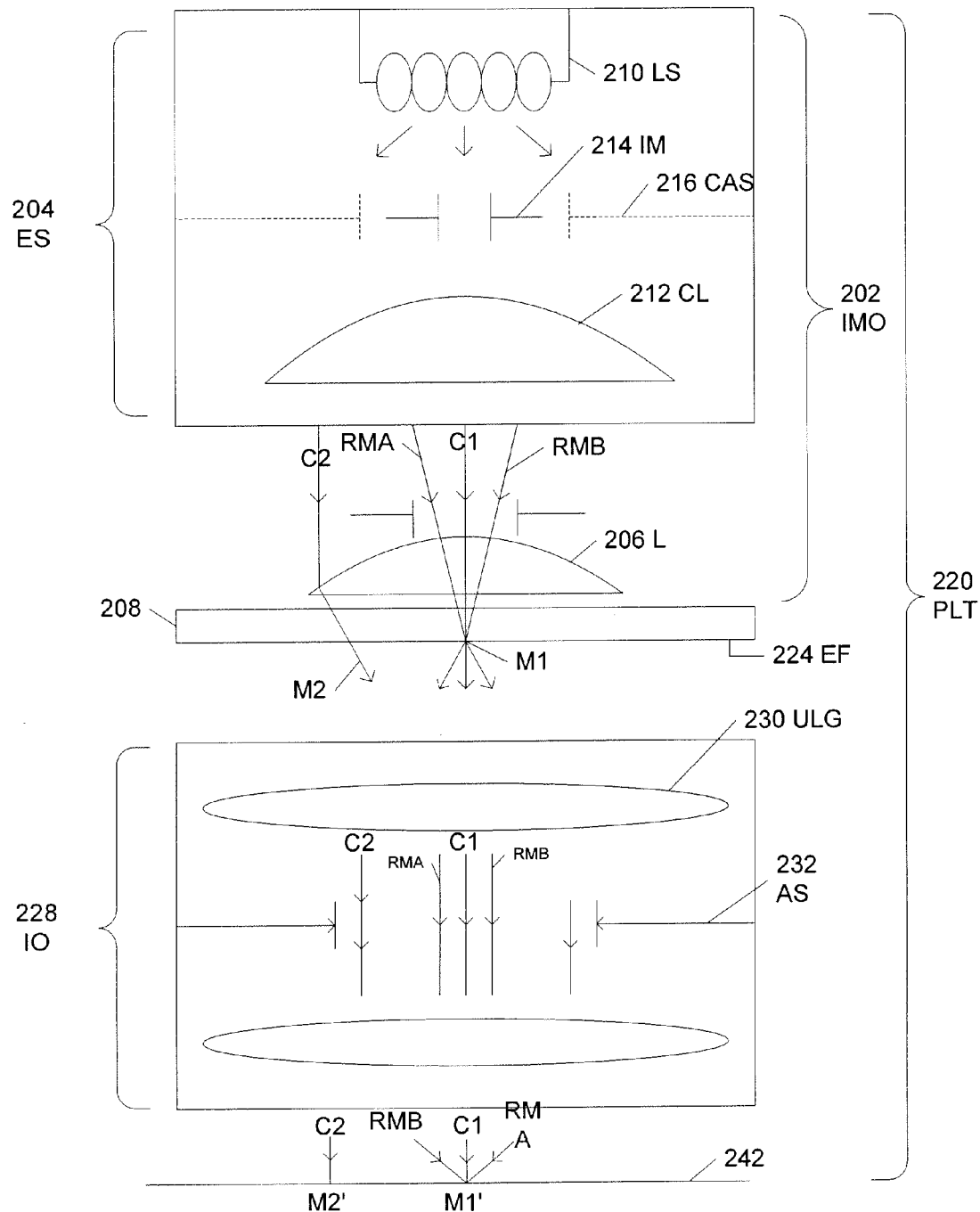
FIG. 2 is a block diagram illustrating aspects of a projection lithography tool and embodiments of this invention in a projection lithography tool.

FIG. 2 is a block diagram of a lithography projection tool 220. In general, the lithography projection tool 220 includes an illumination source at low partial coherence with chief rays that vary regularly as a function of position. The modified source illuminates a reticle 208 that includes an optical element and a face encoded with measurement fiducials. The measurement fiducials are exposed onto a sensing plane 242. The relative positions of the exposed measurement fiducials on the sensing plane are measured. A reconstruction of the aberration is made from the measurements and known relative positions of the measurement fiducials of the encoded face.

Illumination Matching Optic

The illumination matching optic (IMO) 202 includes an effective light source (ES) 204 and an optical element illustrated as a lens (L) 206 that is mounted to a reticle 208. The effective source (ES) 204 includes a light source (LS) 210 and a condensing lens (CL) 212 that focuses the light onto a lens 206 mounted on the reticle 208.

The effective light source (ES) 204 also includes an illumination modifying optic IM 214 that is located at a conjugate aperture stop (CAS) 216 of the lithography projection tool 220. Within the projection lithography tool 220, the conjugate aperture stop (CAS) 216 is imaged by the combination of the condenser lens (CL) 212 and other effective source optics (not shown) and upper lens group (ULG) 230 to aperture stop (AS) 232.

Figure 3:
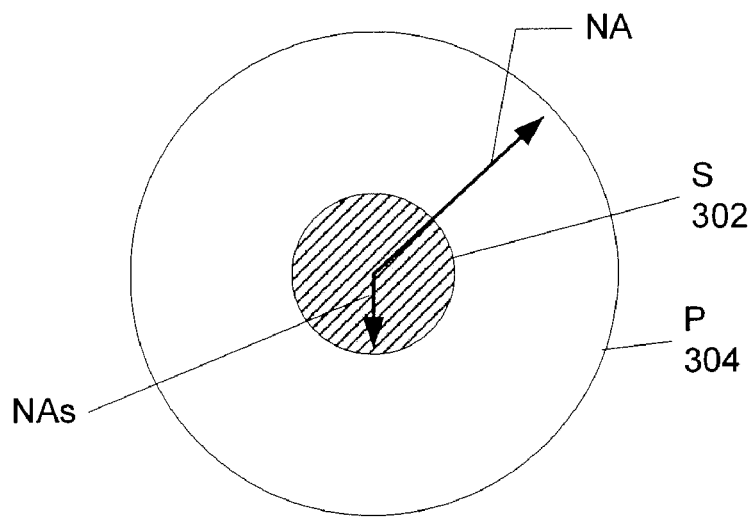
FIG. 3 is a diagram illustrating the appearance of an effective source at a conjugate aperture stop with no illumination modifying optic present.

FIG. 3 is a diagram illustrating the appearance of the effective source (ES) 204 at the conjugate aperture stop (CAS) 216 and aperture stop (AS) 232 if the illumination modifying optic (IM) 214 is removed, see FIG. 2. The lens (L) 206 pupil (P) 304 is the image of the aperture stop in the object space. Because the aperture of the system limits the size of the axial cone of energy that will pass through the optical system, the lens pupil determines the amount of energy accepted by and emitted from the optical system. The maximum cone angle of light accepted or emitted by an optical system is expressed as its numerical aperture. The hatched region 302 illustrates the effective source (ES) with source numerical aperture NAs. As shown in FIG. 3 the effective source (ES) numerical aperture NAs lies within lens pupil (P) 304 which has numerical aperture NA.

Figure 4:
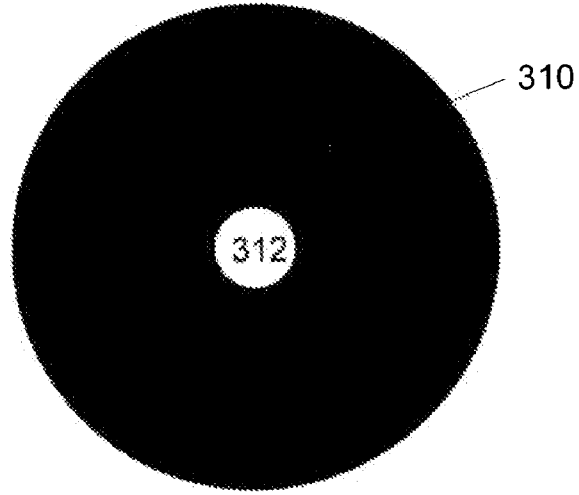
FIG. 4 is a diagram illustrating an example of an illumination modifying optic including an opaque disc with a hole in the center.

FIG. 4 is a diagram illustrating an opaque disk 310 with a hole 312 in it that can be used as one example of an illumination modifying optic IM 214. In the example shown in FIG. 4, the hole 312 is in the center of the opaque disk 310. Positioning the opaque disk 310 at the CAS 216 of the PLT 220, see FIG. 2, reduces the numerical aperture NAs of the effective source ES. Reducing the numerical aperture NAs of the effective source ES increases the number of resolution elements that can be imaged onto the lens pupil P 304. For example, a typical minimum source NAs achievable in a modern scanner is about 0.06, and a typical lens pupil has a numerical aperture of NA of about 0.2. Thus, the number of resolution elements, or NAs, that will fit within the entrance pupil will be:

$$Nr=NA/NAs=0.2/0.06 \sim 3.33 \qquad \text{(Eq. 1)}$$

In the above, NA/NAs are measured on the reticle or entrance pupil side of the imaging objective. Inserting the disk 310 alters the numerical aperture NAs of the effective source ES to a smaller value. For example, the NAs may be reduced to about 0.01, and in accordance with Equation 1, the number of resolution elements across the pupil is now Nr=0.2/0.01=20. Other NAs values may be used to produce a desired number of resolution elements across the pupil.

Figure 5:
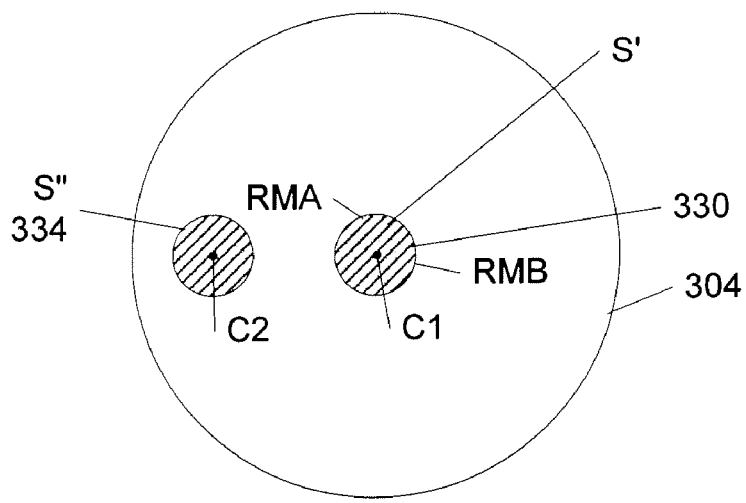
FIG. 5 is a diagram illustrating a source after an illuminating modifying optic has been installed in the effective source.

FIG. 5 illustrates the numerical aperture S' 330 of the effective source ES after the opaque disk 310, being used as illumination modifying optic 214, has been placed at the CAS 216. As discussed in FIG. 4, positioning the opaque disk 310 at the CAS 216, see FIG. 2, reduces the numerical aperture NAs of the effective source ES (204). Thus, light emitted from the effective source ES and incident on lens (L) 206, see FIG. 2, has a reduced numerical aperture in accordance with the size of the hole 312 in the disk 310, that is being used in this example, as image modifying optic (IM) 214.

Returning to FIG. 2, ray bundles of light incident on the lens 206 are bent as they pass through the lens 206 so that chief rays with different angles are incident at different points of the reticle encoded face (EF) 224. The variety and extent of the angles of the chief rays are sufficiently diverse so as to overfill the pupil P of lens 206. As noted above, the lens pupil is the image of the aperture stop 232 imaged as it would be viewed from the light source 210. The lens 206 can be different optical elements, for example, a refractive lens, a conical lens, diffractive optic, or compound lens.

As shown in FIG. 2, a chief ray C1 and marginal rays RMA and RMB are shown incident on a measurement fiducial M1. Referring to FIG. 5, the chief ray C1 is the center of the entire ray bundle emanating from the effective source (ES) 204 and incident on fiducial M1, while RMA and RMB are representative marginal rays, or rays that are on the edge of the effective source (ES) 204 with numerical aperture NAs. Fiducial M1 is located on the optical axis of the lens (L) 206 and thus the chief ray C1 emerges from the lens 206 perpendicular to the encoded face (EF) 224 of the reticle 208. A different chief ray C2 is incident on the measurement fiducial M2, and because it is not incident on the optical axis of lens 206 but is at a displacement h from the optical axis (h=distance between fiducials M1 and M2) it emerges from the encoded face (EF) of the reticle 208 at an angle q from perpendicular. The angle q, in a paraxial approximation, is equal to:

$$q=h/f \qquad \text{(Eq. 2)}$$

where f is the focal length of the lens (L) 206. Referring to FIG. 5, in the pupil (P) 304 the chief ray C2 that emerges from the encoded face (EF) 224 of the reticle 208 is centered on an effective source S" region 334 as a result of the lens bending action and the angular offset from the chief ray C1 that emerged perpendicular to the encoded face (EF) 224 of the reticle 208 as approximated by Equation 2.

As shown in FIG. 2, an effect of the illumination matching optic (IMO) 202 that includes an image modifying optic (IM) 214 is to create, at different points on the encoded face EF 224, narrow ray bundles having chief rays at angles that vary regularly as a function of position on EF 224.

So the effect of the illumination matching optic IMO is to create at different points on an encoded face (EF) a low partial coherence illumination with narrow ray bundles whose chief rays vary regularly as a function of position on the EF. The IMO for this embodiment includes of a lens L, 206 attached to a reticle, 208, and the image matching optic IM placed at the conjugate aperture stop CAS, 216.

Encoded Face

Figure 6A:
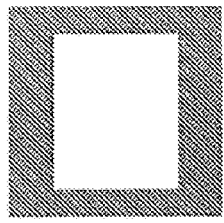
FIGS. 6A-6G are block diagrams illustrating different examples for fiducials.
Figure 6B:
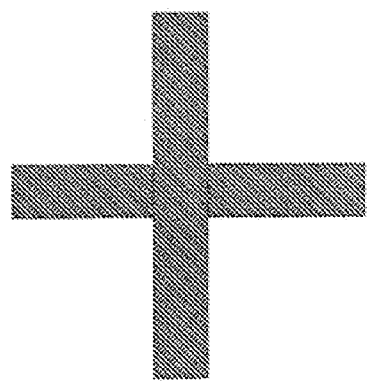
Figure 6C:
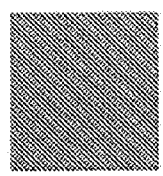
Figure 6D:
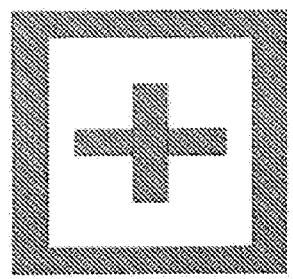
Figure 6E:
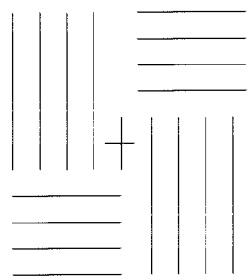
Figure 6F:
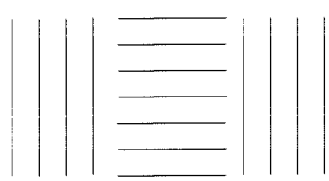
Figure 6G:

As illustrated in FIG. 2, the measurement fiducial M1 on encoded face EF 224 of the reticle 208 is typically at the object plane of the projection lithography tool PLT 220. FIGS. 6A-6G show examples of different types of measurement fiducials that can be used for the fiducial M1 on the encoded face (EF) 224 of the reticle 208. In FIGS. 6A-6G, dark areas represent regions of the encoded face 224 (see FIG. 2) that allow light to pass through. For example, the dark areas can be openings in a chrome surface covering the encoded face (EF) 224 for a dark field mask, which is the typical situation. However, the dark areas could represent regions of the encoded face 224 that do not allow light to pass, thereby making a bright field mask. FIGS. 6A-6C are illustrations of typical measurement fiducial shapes of a square torus, a cross, and a box, respectively. These types of fiducials are often used as measurement fiducials for an overlay tool. FIGS. 6D-6G illustrate examples of measurement fiducials that are commonly used as wafer alignment marks, which are marks read by a stepper or scanner for purposes of aligning a wafer.

Generally, measurement fiducials should be compact so that across a projected field point (FP', 602) (discussed below in connection with FIG. 8) there are approximately Nr (the resolution across the exit pupil, see equation 1) features that can be distinctly measured. In addition, generally a fiducial needs its transverse positions configured such that they can be accurately measured relative to one another. A projected field point (FP') is a region of the PLT projection that has measurement fiducials within it. Measurements made on the projected fiducials within a field point are used to determine the aberration of the PLT at the field point (FP). If P is the spacing between measurement fiducials (the measurement fiducials are shown schematically as squares in FIG. 7) on the encoded face, then a paraxial approximation of the number of projected measurement fiducials for a single field point will be:

$$Np=2*NA*f/P \qquad \text{(Eq. 3)}$$

Setting the number of measurement fiducials for a single field point (Np) equal to the number of resolution elements (Nr) that will fit within the entrance pupil of the lens 206 associated with each field point allows determination of the ratio f/P. Therefore, by choosing the lens focal length, f, any sized field point can be accommodated through the choice of measurement fiducial.

A consideration in selecting the lens and measurement fiducial is that generally it is desirable that the change in aberration over the field point FP be small compared to the size of the aberration. The field point is the collection of projected measurement fiducials arriving at a sensing plane SP whose chief rays pass through a single lens 206. As discussed below in connection with FIG. 11, there are generally a plurality of lenses 206 corresponding to a plurality of field points wherein each field point includes a plurality of measurement fiducials. In modern scanners a field point typically corresponds to a region less than about 5-20 mm at the reticle. If isoplanaticity is not maintained (e.g. the change in aberration over the field point is significant, for example greater than about 20%) a useful result for assessing the magnitude of the lens aberrations can still be achieved.

After passing through the illumination matching optic IMO 202 and the measurement fiducial M1 (see FIG. 2) the intensity pattern at the pupil is altered by diffraction from M1.

This alteration can be minimized by utilizing large geometries for M1, for example geometries that are much larger than $\lambda/2*NA$. The alterations can be further ameliorated by utilizing subresolution features and thereby producing an effective slope or gradient in the chrome transmission profile.

Figure 10A:
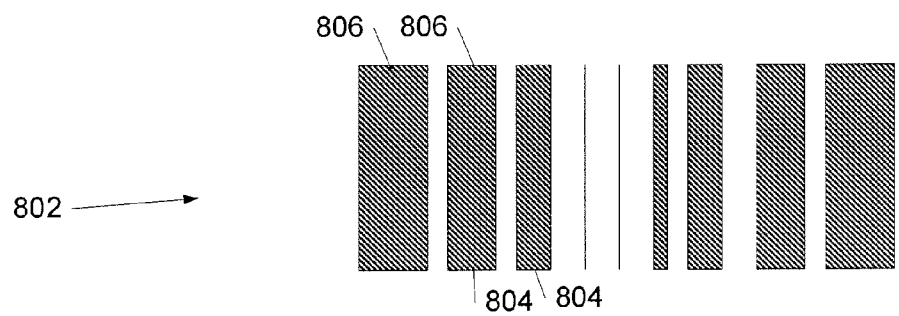
FIG. 10A is a diagram illustrating a fiducial that has interspersed sub resolution features.
Figure 10B:
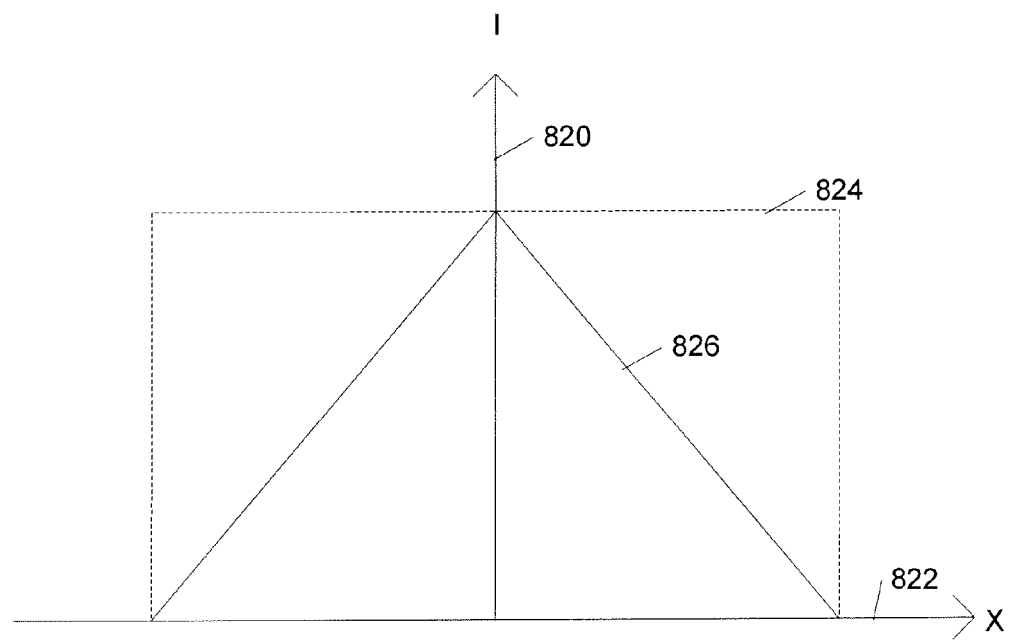
FIG. 10B is a graph that illustrates examples of intensity profiles that can be produced by measurements fiducials.

FIG. 10A shows an example of a measurement fiducial with a clear opening in chrome 802 on the encoded face EF 224 of reticle 208 that has interspersed sub resolution (<$\lambda$/2*NA) chrome openings 804 and spaces 806. FIG. 10B illustrates examples of intensity profiles that can be produced by measurement fiducials such as shown in FIG. 10A. In FIG. 10B the vertical axis 820 represents light intensity at the sensing, or image, plane 242 and the horizontal axis 822 represents distance across the projected measurement fiducial. The intensity profile of a measurement fiducial that does not include a gradient would have a sharp-shouldered intensity profile indicated by the dashed line 824. The intensity profile of a measurement fiducial that includes a gradient, such as illustrated in FIG. 8A, has what is called a rounded intensity profile 826. The rounding of the intensity profile reduces the light intensity near the edge of the fiducial and thereby helps reduce the effects of the diffraction. In either case, if the geometry and details of the measurement fiducials M1 are known, then the blurring, or effect, on the pupil intensity distribution S' will be known and will be calculable by standard methods known to those skilled in the art.

Thus, the effect of the measurement fiducial M1 on the effective source 204 provided by the IMO 202 is known and in general will not be so large as to impact the number of resolution elements as calculated from Equation 1. Furthermore, the size and placement pitch of the measurement fiducials and can be chosen by adjusting the focal length of the lens L 206. The diffractive impact of measurement fiducials is readily accounted for according to conventional knowledge of those skilled in the art.

Exposure

Figure 7:
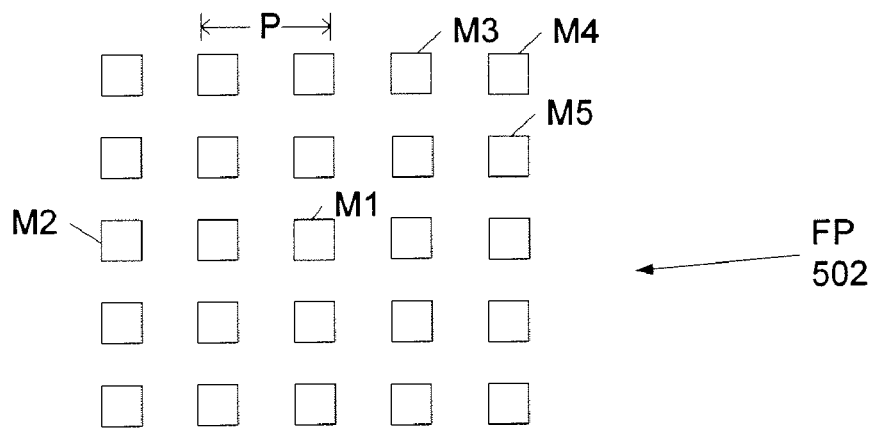
FIG. 7 is a diagram illustrating a 5×5 array of measurements fiducials across a field point.

Referring again to FIG. 2, a sensing plane (SP) 242 is exposed resulting in an array of measurement fiducials that are projected onto the SP 242. The sensing plane (SP) 242 is sometimes also referred to as the image plane or the wafer plane. FIG. 7 illustrates a 5×5 array of measurement fiducials that are projected across a field point (FP) 502. A field point (FP) is a region of the sensing plane containing the projections of measurement fiducials whose chief rays pass through the same lens (L) 206 of a plurality of lenses (L) (not shown). In the example illustrated in FIG. 7, the measurement fiducials are uniformly spaced apart at a pitch P. In other examples, the measurement fiducials may be spaced non-uniformly spaced apart at known pitches. The measurement fiducials are projected through the pupil 304 of the lens (L) 206 as illustrated in FIG. 5, so not all of the measurement fiducials are projected onto the SP 242 because some of the fiducials near the edge of the array of fiducials are located outside the lens (L) 206 pupil (P) 304 and thus will not pass through the aperture stop 232.

Figure 8:
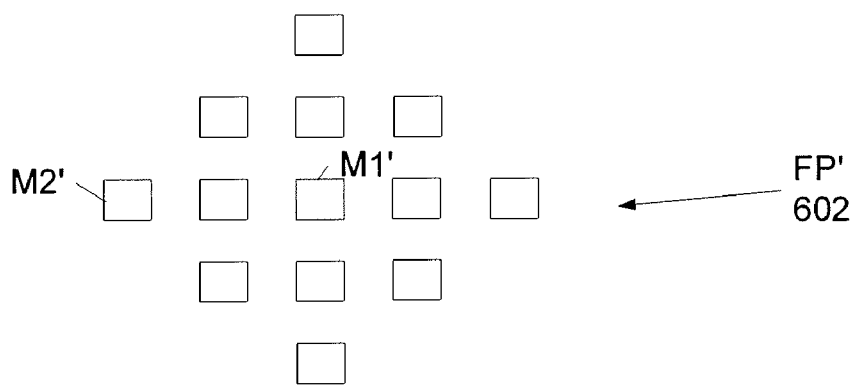
FIG. 8 is a diagram illustrating a 5×5 array of measurement fiducials projected onto a sensing plane.

FIG. 8 illustrates the projections of measurement fiducials that pass through the aperture stop 232 and are projected onto the SP 242 across FP' 602. As shown in FIG. 8, the FIG. 7 measurement fiducials M3, M4, and M5 are not projected, or printed, onto the SP 242. In the example illustrated in FIGS. 7 and 8, measurement fiducials M3, M4, and M5 are not printed or projected onto the SP because their chief rays and ray bundles fall outside of the pupil (P) 304 of the lens (L) 206 as illustrated in FIG. 5. The measurement fiducials whose chief rays and ray bundles pass through the pupil (P) are projected onto the SP 242. The measurement fiducials that are printed in this way, as shown in FIG. 8, include M1' and M2'.

Figure 9:
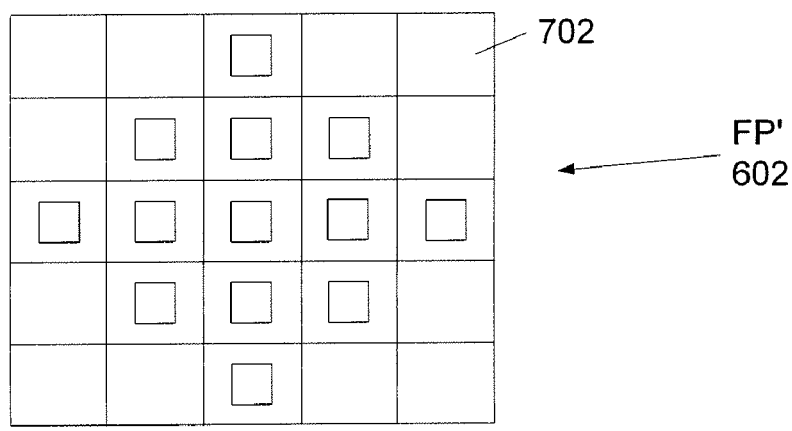
FIG. 9 is a diagram illustrating a reference array projected onto a sensing plane.

FIG. 9 illustrates an example of a reference array (MO) 702 that is projected onto SP using an ordinary reticle without the illumination matching optic IMO modifying the chief ray angles and effective source size. The reference array (MO) 702 is impacted by aberrations in a constant manner (over an isoplanatic patch) while projected measurement fiducials are impacted individually and differently by aberrations. The resulting projected field point array (FP') 602 can be used by overlay metrology tools or other relative positional measurement tools to assess the displacements in the projected measurement fiducials.

The sensing plane (SP) 242 (FIG. 2) is typically a photoresist coated wafer at an arbitrary focal position of the IO 228. The effect of arbitrary focal position is measured. The SP could also be an electronic sensor such as a CCD array with image matching optics, either part of or separate from the projection lithography tool PLT 220.

Measurement

As noted above, FIGS. 6A-6C are typical measurement fiducials and can be used, for example, with a sensing plane (SP) that is a photoresist coated wafer and a measuring apparatus, such as, an overlay metrology tool such as a KLA5200 or a scanner equipped with suitable pattern recognition (e.g. bar in bar pattern recognition). When accompanied by complementary alignment fiducials (schematically, reference array (MO) 702 of FIG. 9) they can be read with high precision and repeatability (<3 nm). These features (when projected onto a wafer) could also be measured using an absolute metrology tool such as a Leica LMS IPRO. In this case, a reference array (MO) is not needed.

Wafer alignment marks, such as illustrated in FIGS. 6D-6G, can be projected onto SP and used for either absolute or relative (overlay) metrology. To use in absolute metrology mode, the projected field point FP' without the reference array (MO), see FIG. 8, is exposed onto the sensing plane, typically a wafer. The projected image on the wafer is then measured using the scanner wafer alignment subsystem to determine the position of each projected measurement fiducial on the projected image. To use in an overlay or relative mode, the projected field point FP' with reference array (MO), see FIG. 9, is exposed onto the wafer. Thus, the MO array includes wafer alignment marks projected from the reference reticle that places the marks in proximity to the M1' M2' . . . or MA array. The wafer alignment system is then used to measure offsets from the reference marks to the projected fiducials.

Another measurement technique utilizes an electronic detector (either integral of, or detachable from the lithography tool) capable of measuring the spacing between the projected fiducials either one at a time or in parallel. Such a system could utilize a reference array (MO) measurement.

Reconstruction

Ray bundles S', S" (FIG. 5) sample very different portions of the lens (L) 206 and are deviated at the sensor plane SP (FIG. 2) from their ideal positions (equal to position on encoded face/magnification) by lens aberrations in the manner described in Smith et al., U.S. Pat. No. 5,828,455 (herein incorporated by reference). The projected deviations due to the lens aberrations is given by Equation 4:

$$(dx, dy) = (\lambda/2\pi NAi) * \int d^2 n W(n) \nabla(\phi(n)) / \int d^2 n W(n) \quad \text{(Eq 4)}$$

where:

$\lambda$ = wavelength of light from the effective source ES

NAi = numerical aperture on the image side = M*NA

N=transverse (nx,ny) direction cosine vector for position in exit pupil

W(n)=I(n)=intensity of effective source after passing through IMO=(for example) intensity of S' or S" for measurement fiducials M1 and M2 respectively φ(n)=optical aberration of the projection lithographic tool.

For the projected measurement fiducial M1', I(n) is >0 over the region S' of FIG. 5 so that the influence of the aberrations is just the weighted slope of grad (φ(n)) over this area of the pupil. Thus as discussed in the two Smith patents referenced above, taking positional or differential offset measurements at an array of positions for the projected measurement fiducials, we can reconstruct the imaging objective (IO of FIG. 2) aberration. See also, "Method of Zernike Coefficients Extraction for Optics Aberration Measurement" by T. Shiode, S. Okada, H. Takamori, H. Matsuda and S. Fujiware, SPIE Conference on Metrology, Inspection, and Process Control for Microlithography, March 2002, incorporated by reference herein in its entirety.

Unit Device

Figure 11A:
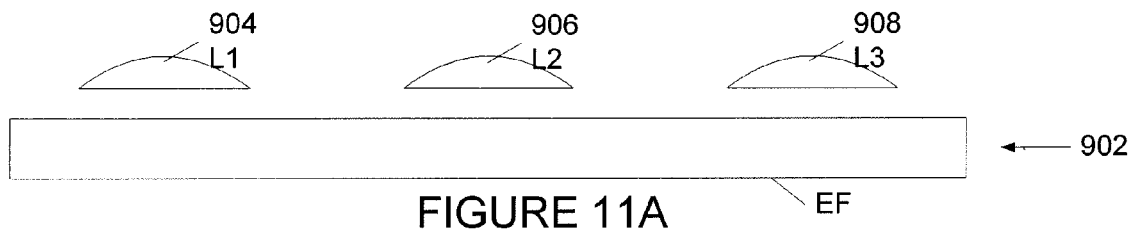
FIG. 11A is a side view of a reticle with optical elements attached.

FIGS. 11A-11C and 4 illustrate a device capable of carrying out aspects of the invention. FIG. 11A shows in side view a unit reticle 902 with three optical elements illustrated as lenses (L1, L2, L3) 904, 906, and 908, respectively attached. Optical elements 904, 906, and 908 can be, for example, refractive lenses, conical lenses, diffractive optics, compound lenses or any combination of types of optical elements.

Figure 11B:
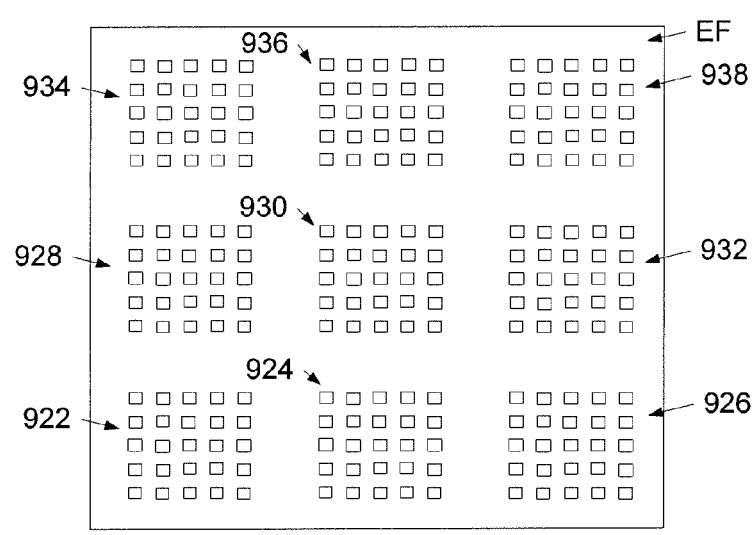
FIG. 11B is a plan view of the reticle shown in FIG. 11A
Figure 11C:
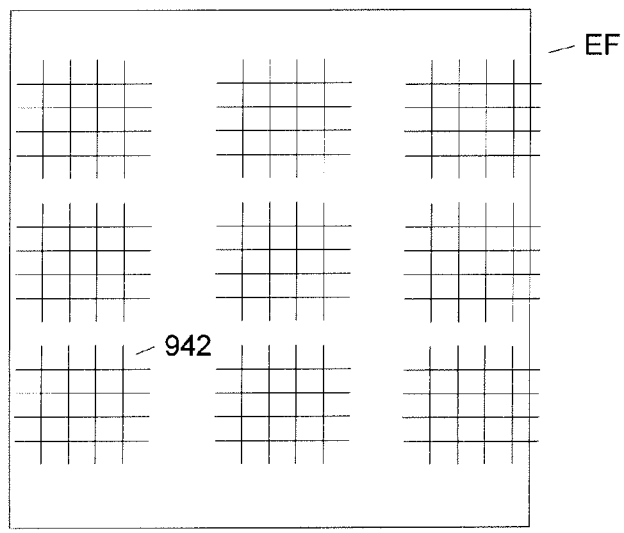
FIG. 11C is a plan view of a reticle with a reference array.

FIG. 11B shows in planar view, nine measurement fiducial arrays or field points (FP1, . . . FP9) 922-938. Each field point is associated with a corresponding lens (not shown). FIG. 11C illustrates an example of a reticle 902 with a reference array (MO). As shown in FIG. 11C, the reticle includes a reference array (MO) with nine field points and corresponding complementary fiducials associated with each field point. This reticle does not have lenses attached. Nine field points are shown for purposes of illustration only, it should be understood that any desired number of field points may be used in accordance with a desired lens packing density and the desired transverse size at each field point. FIG. 4 shows the image modifying optic, IM1, that is inserted into the effective source ES.

More Details and Variations

Equation 2 above describes the chief ray angle q as a function of image height. This is true only in the paraxial approximation. A more exact analysis can account for the exact ray tracing through the lens (L). In the exact analysis, the ray angle is expressed by a formula:

$$\sin(q) = a1*x + a2*x^2 + a3*x^3 + \quad \text{(Eq. 5)}$$

Where the coefficients a1, a2, . . . are functions of the lens geometry. In practice, this formula is generally used.

Optical elements that can be used in place of a lens include conical or axicon optics, compound (multiple) lenses, diffractive optics, and reflective optics. Especially in the case of reflective optics, the optical element can be detached from the reticle that includes the encoded face and mounted in the projection imaging tool as a separate subsystem. This may be desirable in X-ray or EUV systems utilizing all reflective optics.

The image modifying optic IM (see FIG. 2) can be a diffractive optical element. In that case, it will be located at a plane other than CAS and will act to efficiently shape the source.

In another variation, the optical element can be replaced by a pinhole or small clear opening above the encoded face. Then rather than decreasing the size of the effective source, an image modifying optic IN that increases the size of the sources S' and S" to overfill pupil is used. A diffuser is an example of such an IN. The optical element (pinhole) then restricts the ray bundle diameter incident and defines the chief ray angle incident on each measurement fiducial on EF.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes, which come with the meaning and range of equivalency of the claims, are to be embraced within their scope.

We claim:

1. A projection lithography tool comprising:

an effective light source comprising a light source;

a condensing lens configured to accept light from the light source; and an illumination modifying optic between the light source and the condensing lens, wherein the illumination modifying optic is located at a conjugate aperture stop of an image plane of a projection lens system, the illumination modifying optic is configured such that light from the light source that passes through the illumination modifying optic and condensing lens forms a plurality of light ray bundles with corresponding chief rays;

a reticle upon which the light ray bundles are projected, the reticle comprising:

an array of field points, wherein each field point comprises an array of fiducials; and an array of optical elements, wherein an optical element is associated with each of the field points and whose chief rays pass though unique positions in an aperture stop; and an upper lens group wherein the conjugate aperture stop is imaged by the combination of the condenser lens and the upper lens group onto the aperture stop, the upper lens group further including optics to image the fiducials onto a sensing plane.

2. A projection lithography tool as defined in claim 1, wherein the optical element is a refractive lens.

3. A projection lithography tool as defined in claim 1, wherein the optical element is a conical lens.

4. A projection lithography tool as defined in claim 1, wherein the optical element is a diffractive optic.

5. A projection lithography tool as defined in claim 1, wherein the optical element is a compound lens.

6. A projection lithography tool as defined in claim 1, wherein the measurement fiducials are scanner wafer alignment marks.

7. A projection lithography tool as defined in claim 1, wherein the measurement fiducials are stepper wafer alignment marks.

8. A projection lithography tool as defined in claim 1, wherein the measurement fiducials are square toruses.

9. A projection lithography tool as defined in claim 1, wherein the measurement fiducials are crosses.

10. A projection lithography tool as defined in claim 1, wherein the measurement fiducials include subresolution features to thereby produce a gradient in transmission.

11. A projection lithography tool as defined in claim 1, wherein the illumination modifying optic is an opaque disk with a hole in it.

12. A projection lithography tool as defined in claim 1, wherein the illumination modifying optic is a diffuser.

* * * * *